US010318675B2

(12) United States Patent
Elford

(10) Patent No.: US 10,318,675 B2
(45) Date of Patent: Jun. 11, 2019

(54) POST-PROCESSING SYSTEM FOR FINITE ELEMENT ANALYSIS

(71) Applicant: The Boeing Company, Huntington Beach, CA (US)

(72) Inventor: Michael Charles Elford, Brisbane (AU)

(73) Assignee: The Boeing Company, Chicago, IL (US)

( * ) Notice: Subject to any disclaimer, the term of this patent is extended or adjusted under 35 U.S.C. 154(b) by 602 days.

(21) Appl. No.: 14/798,017

(22) Filed: Jul. 13, 2015

(65) Prior Publication Data

US 2017/0017739 A1    Jan. 19, 2017

(51) Int. Cl.

| | |
|---|---|
| *G06F 7/60* | (2006.01) |
| *G06F 17/10* | (2006.01) |
| *G06F 17/50* | (2006.01) |
| *G06T 17/20* | (2006.01) |
| *G06T 19/00* | (2011.01) |

(52) U.S. Cl.
CPC .......... *G06F 17/5018* (2013.01); *G06F 17/10* (2013.01); *G06T 17/20* (2013.01); *G06T 19/00* (2013.01); *G06T 2219/008* (2013.01)

(58) Field of Classification Search
None
See application file for complete search history.

(56) References Cited

U.S. PATENT DOCUMENTS

2006/0005613 A1* 1/2006 Kuwajima ............. G01N 19/02
73/104

FOREIGN PATENT DOCUMENTS

EP    0881585 A1    12/1998

OTHER PUBLICATIONS

Greenough, Christopher, "Generating a Cut-Plane from a Three-Dimensional Mesh", Oct. 27, 1999. (Year: 1999).*
Lira, Wiilliam et al., A Modeling Methodology for Finite Element Mesh Generation of Multi-Region Models with Parametric Surfaces, 2002, Computers & Graphics 26, Elsevier Science Ltd. (Year: 2002).*
Baptista, A.J. et al., "Trimming of 3D Solid Finite Element Meshes using Parametric Surfaces: Application to Sheet Metal Forming" Apr. 18, 2006, Finite Elements in Analysis and Design 42, Elsevier B.V. (Year: 2006).*

(Continued)

*Primary Examiner* — Cedric Johnson
(74) *Attorney, Agent, or Firm* — Womble Bond Dickinson (US) LLP

(57) ABSTRACT

An apparatus is provided for implementation of a post-processing system for providing post-processing analysis of a numerical model. The post-processing system may render a numerical model that represents a structural product by a mesh of elements. A dynamically adjustable user-defined string across the mesh is generated and a set of intermediate points that coincide with intersection of the string and edges of at least some of the elements of the mesh is created. An interpolated dataset, for which a plot is subsequently generated, is calculated from the nodal dataset and at least some nodal points. In response to adjustment of the string, a corresponding adjusted string is generated, a new set of intermediate points is created, and an interpolated dataset with which the new set of intermediate points is associated is calculated.

18 Claims, 9 Drawing Sheets

(56) References Cited

OTHER PUBLICATIONS

Rheinboldt, Werner et al. ("On a Data Structure for Adaptive Finite Element Mesh Refinements"), Jun. 2, 1980, ACM Transactions on Mathematical Software, vol. 6, No. 2, ACM. (Year: 1980).*
University of Colorado at Boulder, Department of Aerospace Engineering Sciences, Graduate Core Course ASEN 5007, Introduction to Finite Element Methods (IFEM), Part I: Finite Element Discretization and the Direct Stiffness Method, Chapter 6: FEM Modeling: Introduction; pp. 6-1-6-15; website visited Jul. 13, 2015; http://www.colorado.edu/engineering/CAS/courses.d/IFEM.d/IFEM.Ch06.d/IFEM.Ch06.pdf.
Szymon Rusinkiewicz; Estimating Curvatures and Their Derivatives on Triangle Meshes; Sep. 2004; pp. 1-8; Princeton University.
European Search Report dated Nov. 17, 2016 for Application No. 16178594.4.
Christopher Greenough, "Generating a Cut-plane from a Three-dimensional Mesh", Oct. 27, 1999, XP002763885, pp. 1-2.
A.J. Baptista et al., "Trimming of 3D Solid Finite Element Meshes Using Parametric Surfaces: Application to Sheet Metal Forming", Finite Elements in Analysis and Design, vol. 42, 2006, pp. 1053-1060.
William M. Lira et al., "Multiple Intersections of Finite-Element Surfaxe Meshes", XP002409005, Retrieved from Internet Nov. 24, 2006.

* cited by examiner

POST-PROCESSING SYSTEM FOR FINITE ELEMENT ANALYSIS

TECHNOLOGICAL FIELD

The present disclosure relates generally to numerical modeling and, in particular, to post-processing analysis of a numerical model.

BACKGROUND

Numerical modeling and analysis is an important tool in the design and verification of many engineered structural products and the structural components of which they are composed. One common numerical modeling and analysis technique is finite element modeling and analysis. In accordance with various numerical modeling analysis techniques, computer models may define a working environment in terms of geometry, elements, properties, loads, constraints and the like, and can thus be solved and analyzed to determine structural integrity of an engineered structural product within that working environment, for example. Through numerical modeling and analysis and in particular finite element analysis, it may be possible to break a complex system down into a manageable (finite) number of elements (e.g., a curve drawn as a series of steps). These computer models and their analysis may be used for several purposes, such as to help determine the behavior of a new airplane product design under various load environments.

Pre-processing and data visualization software for simulating a numerical model, such as a finite element model having a finite element mesh, generally provide a means for extracting data across a slice (which may also be known as a cut or cross-section) of the model, such as a slice between adjacent elements. However, during post-processing, the method of extracting raw numerical data for graphing, exporting, and further analysis involves a reasonable amount of user interaction and manual processing, such that it may be time and resource prohibitive to extract data across a slice that does not neatly correspond to a boundary line between elements (i.e. along the nodes) or involves a significant number of elements. In particular, a single finite element mesh for a structural product can comprise more than one hundred thousand elements. As a result, tasks such as identifying elements along a given path, interpolating data and comparing measured values to simulated values, along a given path, are fairly cumbersome for an individual to manually complete and provide accurate results in reasonable time frame. It may therefore be desirable to have a system and method that addresses these challenges, and improves upon existing practices.

BRIEF SUMMARY

Example implementations of the present disclosure are directed to an improved apparatus, method and computer-readable storage medium for at least post-processing a numerical model such as a finite element model. The present disclosure includes, without limitation, the following example implementations. In some example implementations, a method is provided for at least post processing a numerical model.

The method includes rendering a numerical model of a structural product. The numerical model may represent the structural product by a mesh of elements. Each of the elements may possess a set of nodal points associated with a nodal dataset in which each nodal point is connected by an edge to each adjacent nodal point, and in which the nodal dataset for each set of nodal points includes values of a property or state of the structural product at respective nodal points of the set of nodal points. The method may also include generating a user-defined string across at least a portion of the mesh in which the string may be dynamically adjustable. After generation of the user-defined string, the method includes creating a set of intermediate points that coincide with intersection of the string and edges of at least some of the elements of the mesh, and calculating an interpolated dataset with which the set of intermediate points is associated. The interpolated dataset may be calculated from the nodal dataset of each set of nodal points including a nodal point of the at least some of the nodal points. The method may also include generating a plot of the interpolated dataset. In response to the adjustment of the string, the method includes generating a corresponding adjusted string, creating a new set of intermediate points that coincide with intersection of the adjusted string and edges of at least some of the elements of the mesh, and calculating an interpolated dataset with which the new set of intermediate points is associated.

In some example implementations of the method of the preceding or any subsequent example implementation, or any combination thereof, generating the string includes automatically generating the string based on one or more user-defined parameters of a slice plane that intersects the mesh at the string.

In some example implementations of the method of any preceding or any subsequent example implementation, or any combination thereof, the method further comprises receiving the one or more user-defined parameters via respectively one or more graphical user interface control elements, wherein the adjustment of the string is effectuated by adjustment of at least one of the one or more user-defined parameters, and receiving the adjustment of the at least one of the one or more user-defined parameters via at least one of the one or more graphical user interface control elements.

In some example implementations of the method of any preceding or any subsequent example implementation, or any combination thereof, the string intersects at least one nodal point of at least one set of nodal points, and generating the plot of the interpolated dataset includes generating the plot of the interpolated dataset and data of the at least one nodal point from the nodal dataset for the at least one set of nodal points.

In some example implementations of the method of any preceding or any subsequent example implementation, or any combination thereof, generating the plot of the interpolated dataset includes receiving measurements for a physical instance of the structural product, and simultaneously generating a plot of a corresponding dataset of the measurements for comparison of the corresponding dataset with the interpolated dataset.

In some example implementations of the method of any preceding or any subsequent example implementation, or any combination thereof, the nodal dataset for each set of nodal points including values of a fabrication property of the structural product at respective nodal points of the set of nodal points.

In some example implementations of the method of any preceding or any subsequent example implementation, or any combination thereof, the numerical model is a finite element model representing the structural product by a mesh of finite elements, and the method further comprises performing finite element analysis of the finite element model to produce the nodal dataset for the set of nodal points of each of the finite elements of the mesh, the nodal dataset for each set of nodal points including values of a state variable at respective nodal points of the set of nodal points.

In some example implementations, an apparatus is provided for implementation of at least a post-processing system. The apparatus comprises a processor and a memory storing executable instructions that in response to execution by the processor cause the apparatus to at least perform the method of any preceding example implementation, or any combination thereof. This may include implementation of subsystems of the system, such as a diagramming engine, string generator, interpolator, and graphing engine configured to perform the steps of the method.

In some example implementations, a computer readable storage medium is provided for at least post processing a numerical model. The computer-readable storage medium is non-transitory and has computer-readable program code portions stored therein that, in response to execution by a processor, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
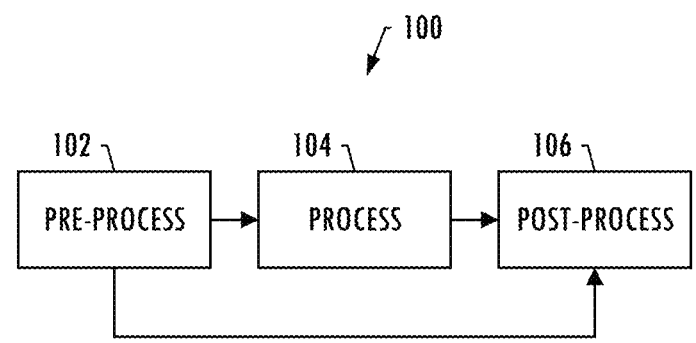
FIG. 1 is an illustration of a numerical modeling and analysis system according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure are generally directed to at least post processing a numerical model of a physical product (e.g., a structural product). Example implementations will be primarily described in conjunction with aerospace applications in which the product may be an aircraft or one or more component parts of an aircraft, such as one or more materials, components, assemblies and sub-assemblies of an aircraft. It should be understood, however, that example implementations may be utilized in conjunction with a variety of other applications, both in the aerospace industry and outside of the aerospace industry. For example, the numerical model may define a computational fluid dynamic model, thermal model, or any other type of model not explicitly set forth herein.

FIG. 1 illustrates a numerical modeling and analysis system 100 according to example implementations of the present disclosure. The numerical modeling and analysis system may be configured to perform a number of different functions or operations, either automatically, under direct operator control, or some combination of thereof. In this regard, the numerical modeling and analysis system may be configured to perform one or more of its functions or operations automatically, that is, without being directly controlled by an operator. Additionally or alternatively, the numerical modeling and analysis system may be configured to perform one or more of its functions or operations under direct operator control.

As explained in greater detail below, in some examples, the numerical modeling and analysis system 100 may be configured to develop an appropriate computer model of a structural product, perform an analysis of the structural product from the numerical model to produce data, and post-process data produced from the analysis. Example implementations may at times be particularly described in the context of a finite element model of a structural product, and performance of a finite element analysis from the finite element model. It should be understood, however, that the numerical modeling system may be configured to develop any of a number of different computer models one or more of which may not be considered a finite element model; and may be configured to perform any of a number of different analyses from the numerical model one or more of which may not be considered finite element analysis. Examples of other suitable analyses include finite difference analysis, finite volume analysis, one or more probabilistic methods, and the like.

The numerical modeling and analysis system 100 may include one or more of each of a number of different subsystems (each an individual system) coupled to one another for performing one or more functions or operations. As shown in FIG. 1, for example, the numerical modeling and analysis system may include a pre-processing system 102, processing system 104 and/or post-processing system 106 that may be coupled to one another. Although shown as part of the numerical modeling and analysis system, one or more of the pre-processing system, processing system and/or post-processing system may instead be separate from but in communication with the numerical modeling and analysis system. It should also be understood that one or more of the subsystems may function or operate as a separate system without regard to others of the subsystems. And further, it should be understood that the numerical modeling and analysis system may include one or more additional or alternative subsystems than those shown in FIG. 1.

The pre-processing system 102 may be generally configured to develop an appropriate computer model (e.g., finite element model) of a structural product. The computer model may represent the structural product by a mesh of elements although it will be readily understood by a person of ordinary skill in the art that the structural product may be represented by any zero, one to or three dimensional element, such as a bar element for example. The elements may be or include one or more disjointed (non-overlapping) components of a mathematical model in which each element may possess a set of distinguishing points called nodal points or nodes. In some example implementations, the nodal points may be located at the corners and/or end points of the elements such that the geometry of an element may be defined by the placement of geometric sets of nodal points.

The nodal dataset for each set of nodal points may include values of a property or state of the structural product at respective nodal points of the set of nodal points. Examples of suitable properties include geometric properties and constitutive properties such as residual thickness, principal curvature, elastic modulus, thermal coefficient of expansion and the like. The constitutive properties may specify the material behavior of the structural product at respective nodal points. Examples of suitable states include state variables such as components of the derived stress and strain tensors, and temperature at the respective nodal points. This method may also be applicable to element-based datasets such as element forces, properties, and the like.

For its operations, the pre-processing system 102 may include or otherwise benefit from commercially-available software tools. Examples of suitable software tools include computer-aided design (CAD) systems, such as CATIA, SolidWorks or the like, available from Dassault Systèmes S.A. of Vélizy-Villacoublay, France. Other examples of suitable software tools include Altair Hypermesh, available from Altair Engineering, Inc. of Troy, Mich.; PATRAN, available from MSC Software Corporation of Newport Beach, Calif.; the ANSYS software suite, available from ANSYS, Inc. of Canonsburg, Pa.; HyperSizer®, available from Collier Research Corporation of Newport News, Va.; GENESIS, available from Vanderplaats R&D, Inc. of Colorado Springs, Colo.; and the like.

The processing system 104 may be generally configured to perform analysis of the structural product from the numerical model. The analysis of the structural product may be or include analysis via one or more algorithms (e.g., governing matrix equations) and/or measurement-based analysis (e.g., measurement comparisons). For example, in the context of finite element analysis, the processing system may be configured to derive and solve governing matrix equations from the numerical model. In some example implementations, the numerical model is a finite model composed of a mesh of finite elements. In other example implementations, the numerical model is a finite volume model composed of volume elements or a finite difference model composed of elements defined by a collection of nodal points. Each element may be embodied in terms of a finite number of degrees of freedom characterized as a value of an unknown function, or function, at a set of nodal points. An element may further comprise degrees of freedom (DOF) that function as a point at which two elements may be connected and specify the state of the element. The degrees of freedom may be defined as the values and/or derivatives of a state variable at connected nodal points in which a state variable may refer to a variable utilized to describe a mathematical state of a model.

In some example implementations, the processing system may be configured to perform analysis of the numerical model to produce a nodal dataset for the set of nodal points of each of the elements of the mesh. The nodal dataset for each set of nodal points may include values of a state variable at respective nodal points of the set of nodal points. In one example implementation, the numerical model is a finite element model representing the structural product by a mesh of finite elements, and the processing system may be configured to perform finite element analysis of the finite element to produce the nodal dataset for the set of nodal points of each of the finite elements of the mesh.

The post-processing 106 system may provide a tool that enables a user to graphically slice a given surface of a mesh model with a slice plane for the purpose of extracting data, and in particular results data, from the model. The user can dynamically rotate the slice plane about the global X, Y, and/or Z axis from a control panel that includes one or more graphical user interface (GUI) control elements. In some example implementations in which the intersection of the slice plane and the mesh result in multiple disconnected segments, the post-processing system may be configured to identify the disconnected segments and target a particular segment for data extraction, based on user-defined parameters, in which values of the disconnected segment may be automatically interpolated. The post-processing system may be further configured to check the validity of the solutions from the processing system (e.g., displacements, stresses, specialized stresses, error indicators); and in some examples, the post-processing system may be configured to perform at least one other appropriate analysis on the numerical model and/or solutions.

For their operations, the processing system 104 and post-processing system 106 may include or otherwise benefit from commercially-available software tools. Examples of suitable tools include Abaqus, available from Dassault Systèmes S.A.; the ANSYS software suite (Fluent); NASTRAN/PATRAN, available from MSC Software Corporation; SolidWorks (COSMOSworks), COMSOL Multiphysics® (FEMLAB), available from COMSOL Inc. of Burlington, Mass.; GENESIS; Altair HyperView, available from Altair Engineering, Inc.; NX (Unigraphics), available from Siemens PLM Software of Plano, Tex.; TAK 2000, available from K&K Associates of Westminster, Colo.; SolidWorks; Pro/ENGINEER, available from PTC Inc. of Needham, Mass.; LS-DYNA®, available from Livermore Software Technology Corporation (LSTC) of Livermore, Calif.; and the like.

Figure 2:
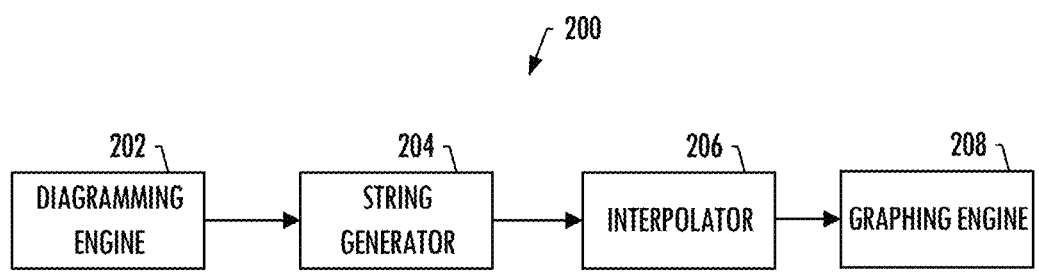
FIG. 2 is an illustration of a suitable post-processing system according to one example implementation.

FIG. 2 illustrates a post-processing system 200 that may be one example of the post-processing system 106 of the numerical modeling and analysis system 100 of FIG. 1. The post-processing system may include one or more of each of any of a number of different subsystems (each an individual system) for performing one or more functions or operations to facilitate providing post-processing analysis of a numerical model. As shown, for example, the post-processing system may include a diagramming engine 202, string generator 204, interpolator 206, and/or graphing engine 208. It should be understood that while the diagramming engine, string generator, interpolator, and graphing engine are shown as part of the post-processing system, one or more of the respective systems may instead be separate from but in communication with the post-processing system or even the pre-processing system and processing system. Further, it should be understood that one or more of the subsystems may function or operate as a separate system without regard to others of the subsystems. And it should be understood that the post-processing system may include one or more additional or alternative subsystems than those shown in FIG. 2.

As explained in greater detail below, the diagramming engine 202 may be generally configured to render a numerical model of a structural product that represents the structural product by a mesh of elements. Each of the elements possesses a set of nodal points associated with a nodal dataset in which each nodal point is connected by an edge to each adjacent nodal point. The nodal dataset for each set of nodal points may include values of a property or state of the structural product at respective nodal points of the set of nodal points. The string generator 204 may be generally configured to generate a user-defined string across at least a portion of the mesh. The interpolator 206 may be generally configured to create a set of intermediate points that coincide with an intersection of the string and edges of at least some of the elements of the mesh. The interpolator may be further configured to calculate an interpolated dataset associated with the set of intermediate points and calculated from the nodal dataset of the set of nodal points possessed by each of the at least some of the elements. The graphing engine 208 may be generally configured to generate plots of the interpolated datasets and data points related to the string. The graphing engine 210 may be configured to generate a plot of at least the interpolated dataset. The string may be dynamically adjustable such that in response to adjustment of the string, the string generator may be further configured to generate a corresponding adjusted string, and the interpolator may be further configured to create a new set of intermediate points that coincide with intersection of the adjusted string and edges of at least some of the elements of the mesh, and calculate an interpolated dataset associated with the new set of intermediate points. As such, the system may advantageously allow an operator to quickly retrieve data along a path that is not perfectly aligned with a row of adjacent nodes, and dynamically change the path without moving one or more nodes and requiring the model to be re-processed.

As previously indicated, the diagramming engine 202 may be generally configured to render a numerical model of a structural product. The numerical model may represent the structural product as a mesh (e.g., polygon mesh) of elements. Each of the elements may possess a set of nodal points associated with a nodal dataset in which each nodal point may be connected by an edge to each adjacent nodal point. The nodal dataset for each set of nodal points may include values of a property or state of the structural product at respective nodal points of the set of nodal points. The diagramming engine may be coupled to the pre-processing system 102 and/or the processing system 104. The diagramming engine may be configured to receive data from the pre-processing system for use in rendering the element model. The diagramming engine may be further configured to receive data from the processing system for use in identifying sets of nodal points, and subsequent nodal datasets, to be associated with the mesh of elements such that the sets of nodal points are built into the rendered numerical model.

The diagramming engine 202 may be configured to generate an image of the structural product, and in particular the numerical model of the structural product, based at least in part on a scene file that includes two-dimensional and/or three-dimensional model data. In some example implementations, the scene file may contain information related to geometric shapes of the structural product, varied viewpoints of the structural product, color coding information, and/or shading data to be utilized in rendering the numerical model. The scene file may be initially generated by the pre-processing system 102 such that the data contained within the scene file may be transmitted to the diagramming engine. The data may then be processed by the diagramming engine such that an image is generated for use in displaying the numerical model. The diagramming engine may generate the image of the numerical model for presentation on a suitable display.

The string generator 204 may be configured to generate a user-defined string across at least a portion of a mesh of elements by which a numerical model (e.g., finite element model) represents a structural product. The string may be or include an interactive query that is formed where a slice plane intersects the numerical model such that the string intersects the edges of at least some of the elements of the mesh.

The string generator 204 may be configured to receive one or more user-defined parameters from which the string may be generated. The string generator may be configured to automatically generate the string based on these user-defined parameter(s), which in some examples may be parameter(s) of a slice plane that intersects the mesh at the string. More particularly, for example, one or more user-defined parameters may define a slice plane (e.g. degrees of rotation for respectively X, Y, and/or Z axes of a slice plane, a relative position of the slice plane), a starting position offset of the string, and/or a length of the string.

In some example implementations, the string generator 204 may be configured to generate the string based at least in part on the definition of a standard slice plane. For example, a user may select a standard plane for use in generating the string as opposed to defining specific aspects of the plane through one or more degrees of rotation or relative position of the plane. In such an example implementation, the definition of the standard plane may be inherently known by the post-processing system 200 based on one or more of standard mathematical logic, business rules, and/or pre-defined parameters provided by an entity associated with the post-processing system.

In some example implementations, the string may be dynamically adjustable such the string generator 204 may be configured to receive an adjustment to the one or more user-defined parameters such that the adjustment of the string is effectuated by the adjustment of at least one of the user-defined parameters. The slice plane may be translated in the normal direction and instantly rotated about any global axis such that interpolated results associated with the string are automatically updated, in real time. Similarly, for example, the string may be shortened and the offset from the original start position to tailor an exact region of the numerical model that should be targeted for data extraction. In some example implementations, the user-defined parameters may collectively define a cross section of the string. In response to the adjustment of the string, the string generator 204 may be further configured to generate a corresponding adjusted string.

The string generator 204 may receive input of one or more user-defined parameters of a string (e.g., cross-section of a string and/or slice plane) via respectively one or more graphical user interface (GUI) control elements of an interactive GUI. The string generation may also receive input of one or more user-selected options for altering the presentation and/or layout of the string via respectively one or more GUI control elements of the interactive GUI. The GUI control elements may be or include buttons, sliders, list boxes, spinners, drop-down list, menus, scroll bars, and the like. In this way, the interactive GUI may graphically display a plurality of parameters that may be adjusted to originally define and/or alter values for use in generating a string.

The string generator 204 may be configured to automatically alter the presentation and/or layout of the string and slice plane with respect to the numerical model (e.g., finite element model) based on one- or more user-defined parameters and/or user-selected options. The user-defined parameters and/or user-selected options may be or include one or more parameters or options that define the display size, initiate requests to display the surface normal along the string, initiate requests to display the slice plane, initiate requests to display the string direction, display results graphs, and/or export results data. In one specific example implementation, the user may request to display the surface normal along the string such that the surface normal may be visualized as a ribbon positioned about the numerical model to allow for dynamic visualization of the surface normal in the intersection curve. For example, this presentation may be enabled in response to the user selecting an option, via a check box, to display the surface normal.

In some example implementations, the string generator 204 may be configured to display a segment of the numerical model in response to the user-defined parameters identifying a segment (e.g. segment number) for which data should be calculated. Segments may be or include collections of discrete planes and/or edges. In particular, the mesh may be divided by the diagramming engine 202 into one or more segments in which the segments may be any combination of open and/or closed loops. In such an example implementation, the element for which the segment is associated and a percentage along each intersected edge may be recorded. The string generator may be further configured to automatically determine segmented portions of the numerical model such that the determined portions may be available for selection by the user and targeted for further data extraction.

In some example implementations, the string generator 202 may be configured to display data associated with a generated string via a display window. For example, the display window may include information such as the perimeter, segment length, area bounded by the string, in instances in which the string is a loop, and the numerical integration of values across the string and within the loop area.

Figure 3:
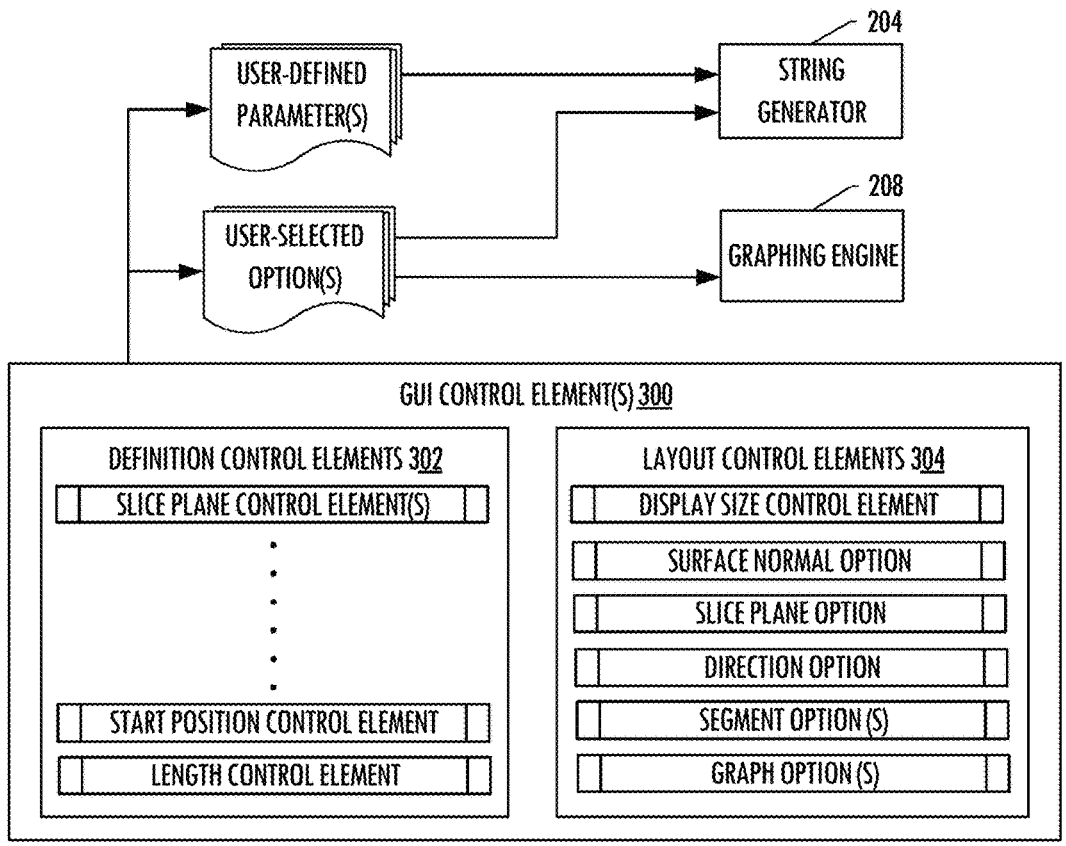
FIG. 3 is an illustration of graphical user interface (GUI) control elements according to one example implementation.

As illustrated in FIG. 3, the string generator 204 may receive input of one or more user-defined parameters of a string (e.g., cross-section of a string and/or slice plane) via respectively one or more graphical user interface (GUI) control elements 300 of an interactive GUI. The string generator may also receive input of one or more user-selected options for altering the presentation and/or layout of the string via respectively one or more GUI control elements of the interactive GUI. The GUI control elements may include definition control elements 302 that enable a user to define parameters of the string. Examples of suitable definition control elements may be or include one or more slice plane control elements, start position control elements, and/or string length control elements. The GUI control elements may also include layout control elements 304 that enable a user to select options for altering the presentation of the string. Examples of suitable layout control elements may be or include a display size control element, surface normal option, slice plane option, string direction option, and/or segment(s) option. The GUI control elements may be or include buttons, sliders, list boxes, spinners, drop-down list, menus, scroll bars, and the like. In this way, the interactive GUI may graphically display a plurality of parameters that may be adjusted to originally define and/or alter values for use in generating a string.

Figure 10:
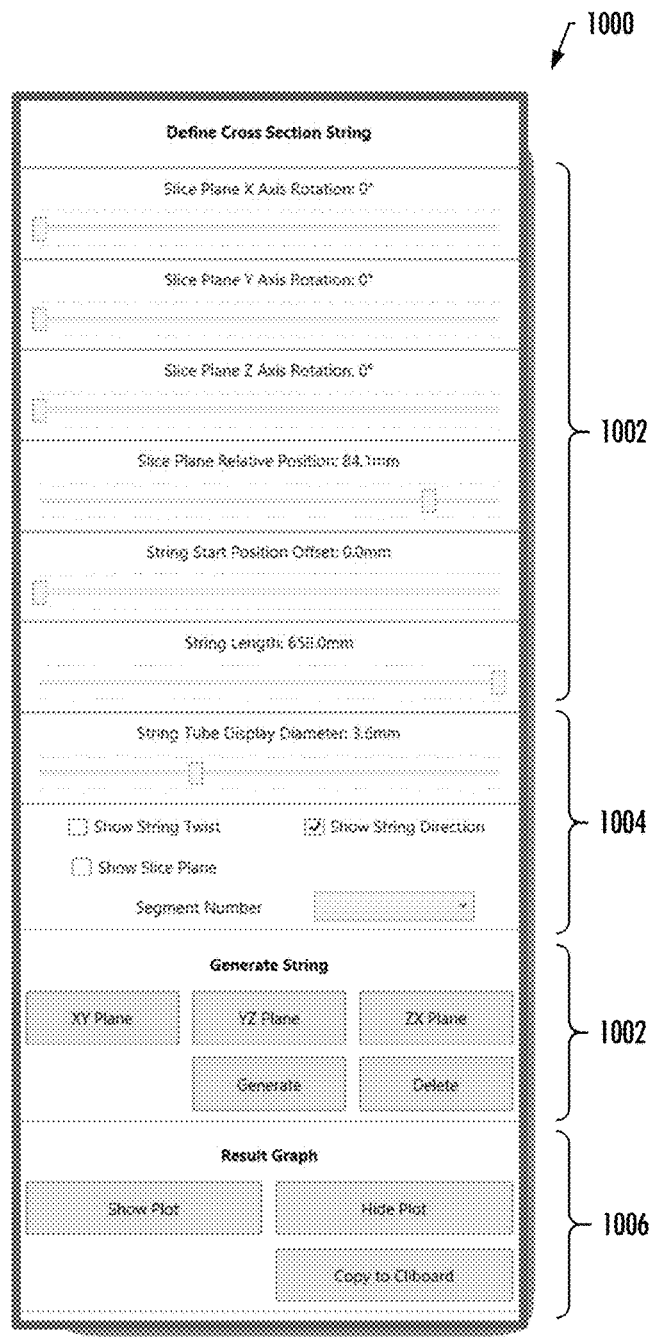
FIG. 10 depicts a GUI control panel according to one example implementation.

As illustrated in FIG. 10, a GUI control panel 1000 may be provided in which the GUI control panel may include one or more of the GUI control elements for specifying user-defined parameters and/or selecting user options. As shown, the one or more GUI control elements may include one or more slice plane control elements 1002 for defining various aspects of the slice plane and string (e.g. slice plane rotation, slice plane positioning, and string length), one or more string layout control elements 1004 for controlling the presentation of the slice plane and string and/or targeting segmented areas of the numerical model for data extraction.

The interpolator 206 may be configured to interpolate values between nodal points by creating a set of intermediate points that coincide with the intersections of the string and the edges of at least some of the elements of the mesh. An interpolated dataset, with which the set of intermediate points is associated, may then be calculated. In particular, the interpolator may be configured to calculate the interpolated dataset from the nodal dataset of each set of nodal points including a nodal point of at least some of the nodal points that correspond to the coinciding edges.

The interpolator 206 may be configured to receive data from the processing system 104, diagramming engine 202, and/or string generator 204 and utilize the received data for use in creating the intermediate set of points and calculating the interpolated dataset. Examples of suitable data may be or include such as one or more parameters that define the string and a plurality of nodal datasets and corresponding values of the nodal points therein. In particular, the interpolator receives data related to the intersection of the string and the edges of the elements and creates the set of intermediate points based at least in part on the received data. The interpolator may further include a calculator configured to receive data related to the nodal datasets and calculate an interpolated dataset with which the set of intermediate points is associated such that the interpolated dataset is calculated based in part on the nodal dataset of each set of nodal points including a nodal point of the at least some of the nodal points.

In some example implementations, the interpolator 206 may be configured to linearly interpolate results at intersection points from nodal values using one or more formulas. In one example implementation, the value at an interpolated point (X) positioned between a first node (A) and a second node (C) may be calculated using the following equation:

$$\text{Value at } X = \text{Value at } C + (\text{Value at } A - \text{Value at } C) * \left( \frac{\text{Distance from } C \text{ to } X}{\text{Distance from } C \text{ to } A} \right)$$

After calculating the interpolated dataset, the interpolator may be further configured to store the dataset as an array of the unique intersection point values.

In some example implementations, in response to an adjustment of the string, the interpolator 206 may be configured to create a new set of intermediate points that coincide with intersection of the adjusted string and edges of at least some of the elements of the mesh. The interpolator may then calculate an interpolated dataset with which the new set of intermediate points is associated.

The graphing engine 208 may be generally configured to generate plots for datasets in which that plots are at least displayed on a GUI associated with the post-processing system 200. As illustrated, the graphing engine may receive data related to a plurality of datasets for use in generating the plots. The datasets may be related to various values defined within the numerical model and/or interpolated by the interpolator 206 such as an interpolated dataset related to the displacement magnitude, residual thickness, principal curvature, or applied force with respect to a specific distance along the string.

The graphing engine 208 may receive dataset values and generate plots for use in providing presentation of the data. The graphing engine may be configured to generate a plot for interpolated datasets including one or more interpolated datasets that are associated with the adjustment of a string. As such, the graphing engine may be configured to automatically update a previous plot in real-time based on the user-defined adjustment of the string. In some example implementations, the string intersects at least one nodal point of at least one set of nodal points such that generating a plot of the interpolated dataset includes generating a plot of the interpolated dataset in addition to data of the nodal(s) point from the nodal dataset that includes the at least one set of nodal points.

The graphing engine 208 may be configured to automatically alter the presentation and/or layout of the plotted datasets based on one- or more user-selected options. The user-selected options may be or include one or more options that requests to display plots, and/or manage interpolated data (e.g. export data, copy data to a clipboard, and the like. For example, the user-defined parameters may indicate a request for the plotted dataset to be hidden and/or shown. The user-defined parameters may additionally request for the data associated with the interpolated dataset to be copied, exported to an external system, downloaded, or the like. In one example implementation, the plot is automatically shown in response to the numerical model being actively presented on a display associated with the post-processing system such that plotted values can be directly copied and used in other applications. For example, the graphed results (e.g. an interpolated dataset) may be copied to a clipboard and pasted within a spreadsheet application for further analysis independent of the post-processing system 200. In one example implementation, the graphed results and/or exported values may include the string coordinates, the position of each coordinate with respect to the string length, and the parameter value at the coordinate.

As further shown in FIG. 3, the graphing engine 208 may receive input of one or more user-selected options for altering the presentation and/or layout of the plots via respectively one or more GUI control elements 300 of the interactive GUI. The GUI control elements may also include layout control elements 304 that enable a user to select options for altering the presentation of the plots. Examples of suitable layout control elements may be or include graph options for altering the presentation of the plot or managing data associated with the plot. The GUI control elements may be or include buttons, sliders, list boxes, spinners, drop-down list, menus, scroll bars, and the like. In this way, the interactive GUI may graphically display a plurality of options that may be selected to originally define and/or alter preferences for use in generating a plot. As such, the GUI control elements of the GUI control panel 1000 of FIG. 10 may also include one or more graphing layout control elements 1006 for managing the presentation of plots and/or plot data associated with the string.

In one example in which the structural product corresponds to a pipe, the post-processing system 200 may be configured to determine a reduction in the cross sectional area post buckling of the pipe such that the results may be used to rapidly assess the amount of flow reduction due to buckling in a pipeline. For example, a series of strings may be sequentially defined, in which each subsequent string is an adjustment of the prior string that further reduces the cross sectional area, such that the graphing engine 208 may be configured to plot the drop in cross sectional area of the pipe with respect to a time step that collectively indicates a reduction in the string area.

Figure 4:
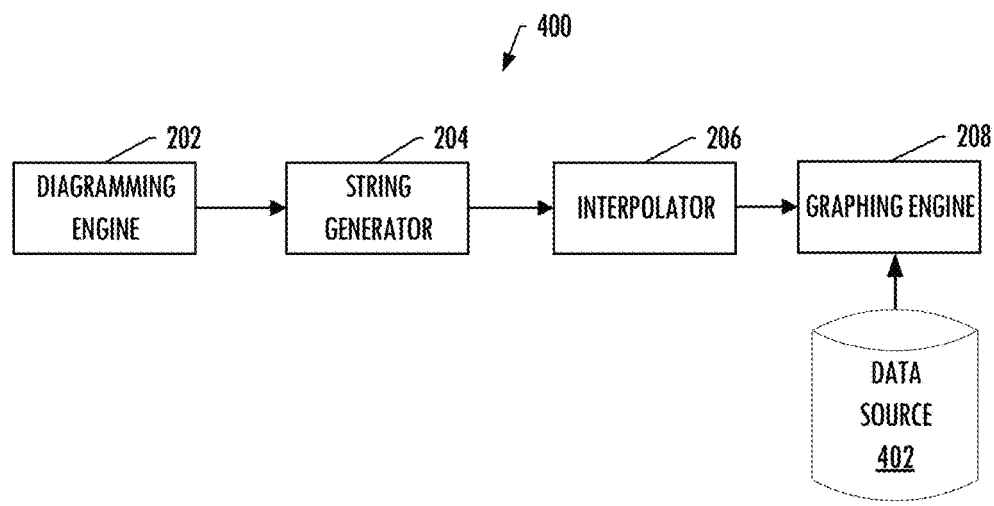
FIG. 4 is an illustration of a suitable post-processing system according to one example implementation.

FIG. 4 illustrates a post-processing system 400 that may be one example of the post-processing system 106 and which is similar to the post-processing system 200 of FIG. 2 but further includes a data source 402 coupled to the graphing engine 208 and containing measurements for comparison with an interpolated dataset. The data source may be or include a repository of measurements and/or a measurement tool for use in measuring physical instances of a structural product and providing related measurement data. Examples of suitable measuring tools may be or include Olympus MagnaMike Hall Effect Thickness Gauge and any number of ultrasonic Non Destructive Inspection (NDI) probes, load cells, strain gauges, or any other measurement devices not explicitly set forth herein.

The graphing engine 208 may be generally configured to receive measurements for a physical instance of the structural product, and simultaneously generate a plot of a corresponding dataset of the measurements for the physical instance of the structural product for comparison with the interpolated dataset. In some example implementations, the graphing engine may be configured to generate plots for use in comparing values for a structural product in which at least a portion of the values may be either values determined by the FEA system 100 (e.g. nodal datasets) or values derived from physical measurements of the structural product.

Figure 5:
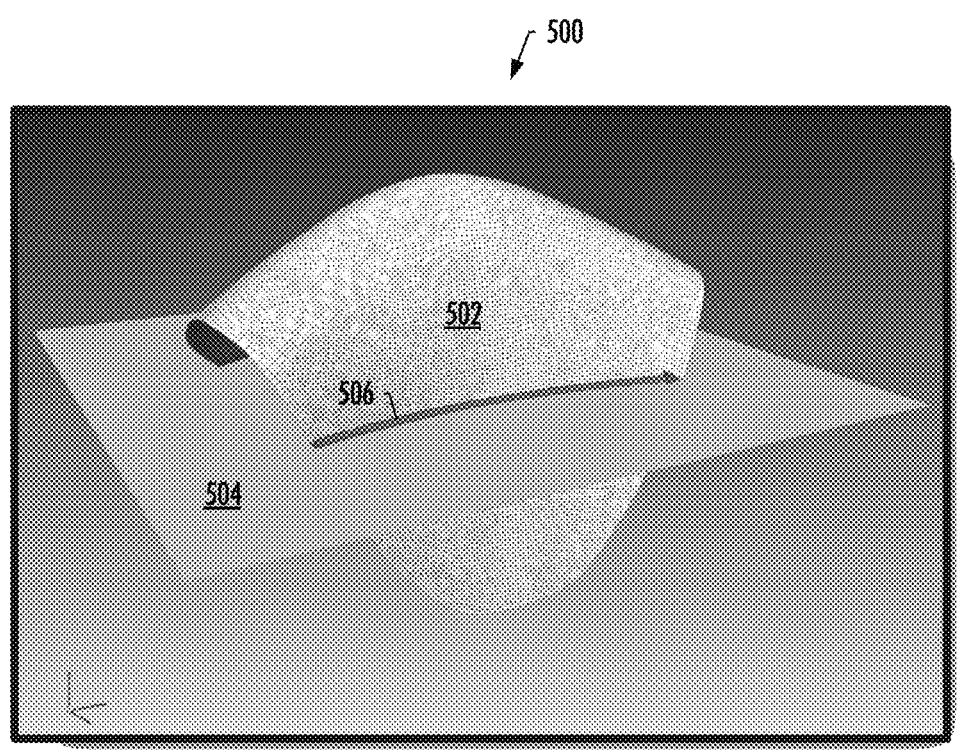
FIG. 5 depicts a numerical model including a string according to one example implementation.
Figure 6:
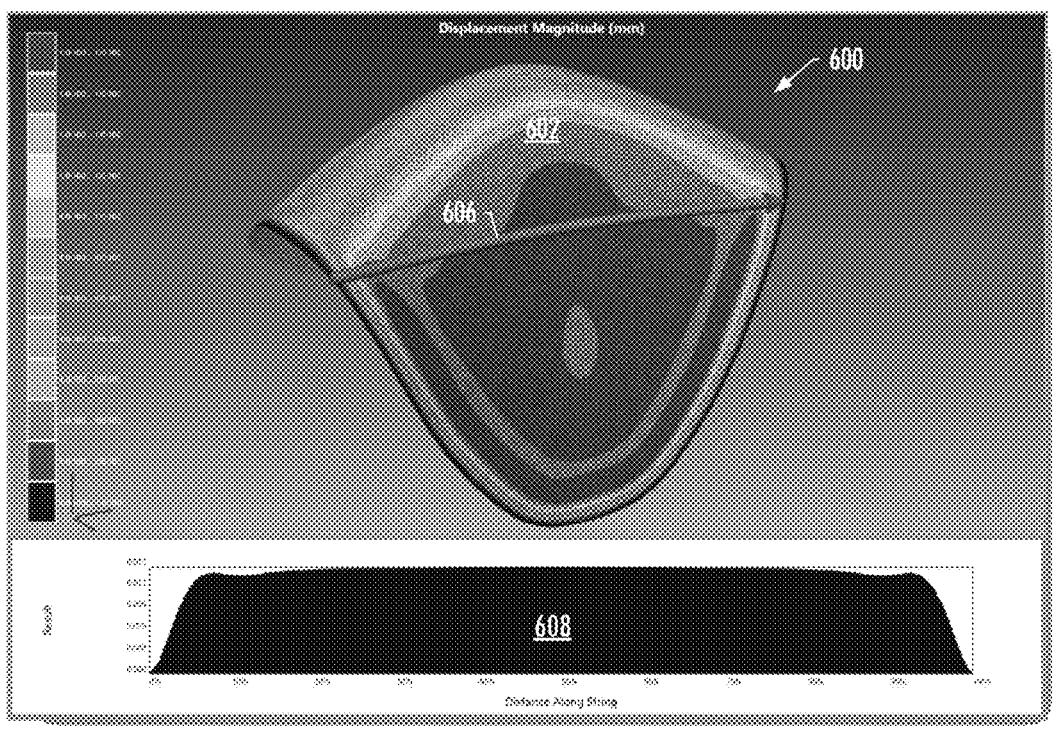
FIG. 6 depicts a contour diagram of the numerical model including the string of FIG. 5, and an associated plot of at least an interpolated dataset, according to one example implementation.

FIG. 5 through FIG. 8 illustrate examples models (e.g. three-dimensional models, finite element models, etc.) of structural products and plots according to example implementations previously discussed herein. FIG. 5 illustrates a numerical model 500, and in particular a finite element model, according to one example implementation. As illustrated, the numerical model may be defined by a mesh of finite elements 502 such that a slice plane 504 may intersect the mesh of finite elements and a string 506 may be defined along the intersection of the slice plane and the edges of the finite elements. FIG. 6 illustrates a contour diagram of the numerical model 600 of FIG. 5, and similarly in the contour diagram, the numerical model may be defined by a mesh of elements 602 having a string 606 defined along the edges of the elements. Also shown in FIG. 6, the numerical model has an associated plot 608 of at least an interpolated dataset values corresponding to the string, according to one example implementation.

Figure 7:
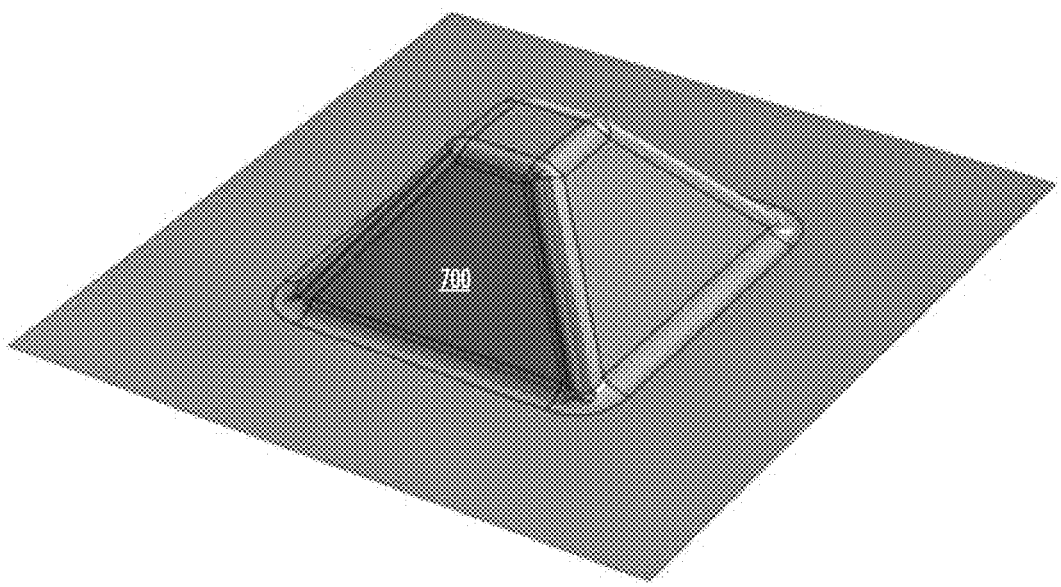
FIG. 7 depicts a three-dimensional model of a structural product, according to one example implementation.
Figure 8:
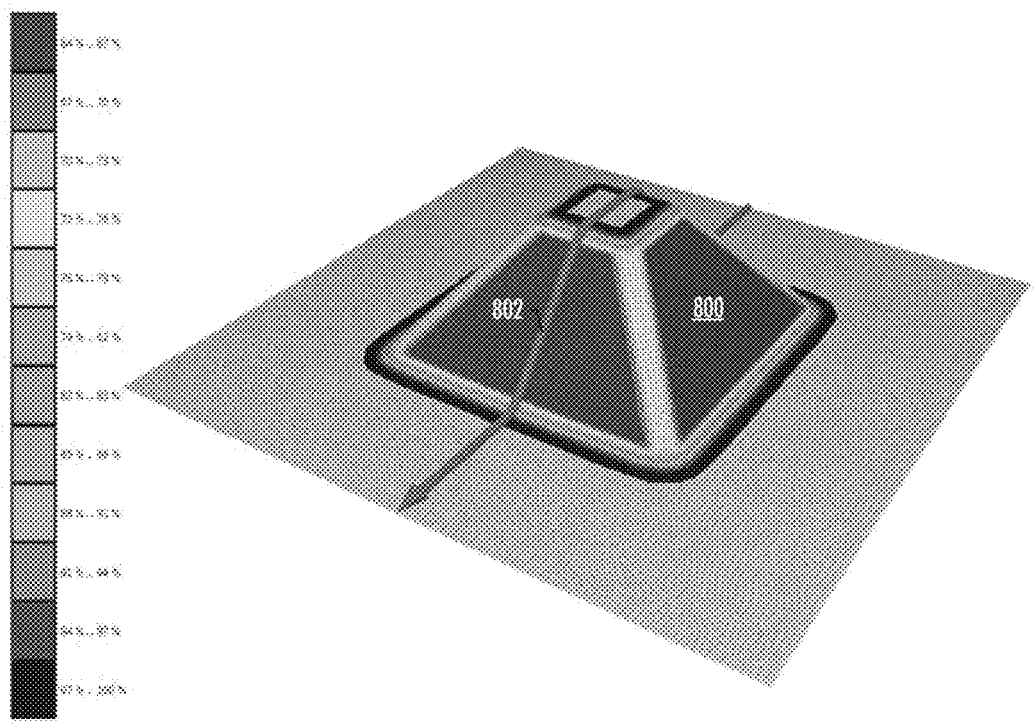
FIG. 8 depicts analysis results of a numerical model of the structural product of FIG. 7, according to one example implementation.
Figure 9:
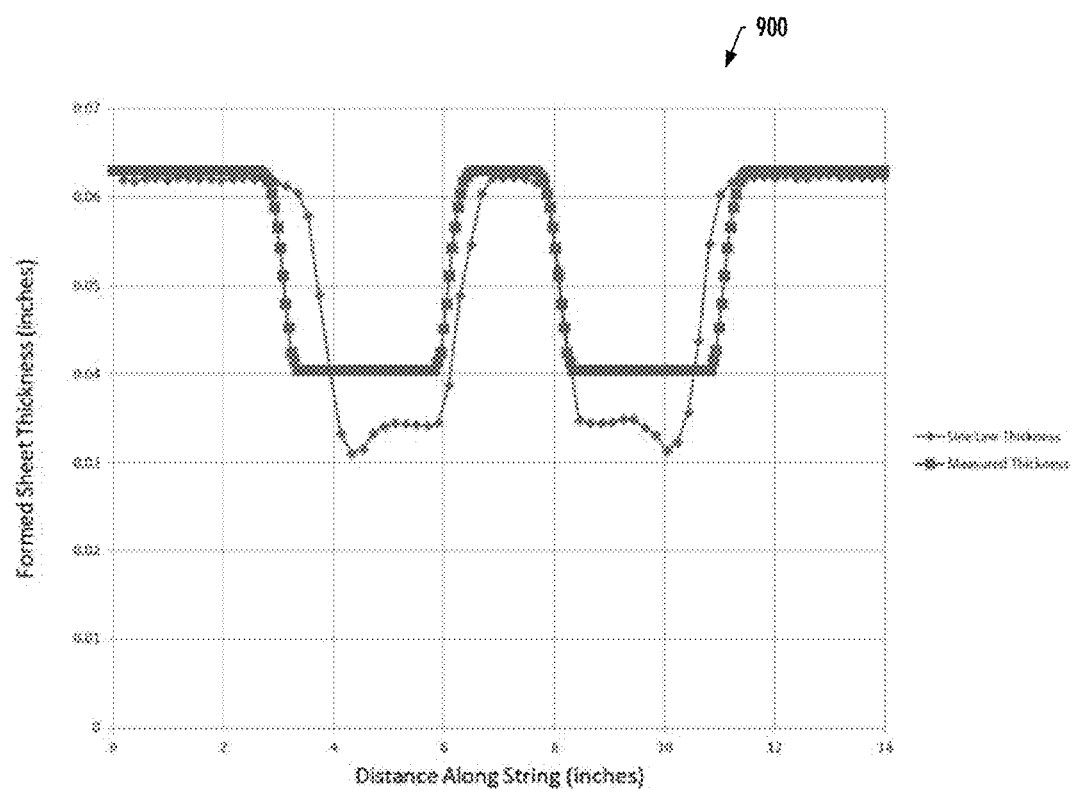
FIG. 9 depicts a comparison plot according to one example implementation.

FIG. 7 illustrates a three-dimensional (3D) model 700 of a structural product, and FIG. 8 illustrates a corresponding numerical model 800 having a string 802 defined along the edges of the elements. FIG. 9 illustrates a plot 900 comparing the values (e.g., sine law thickness) of the string 802 of the numerical model 800 of FIG. 8 to corresponding measurements (e.g. residual thickness) of one or more physical instances of the structural product.

Figure 11:
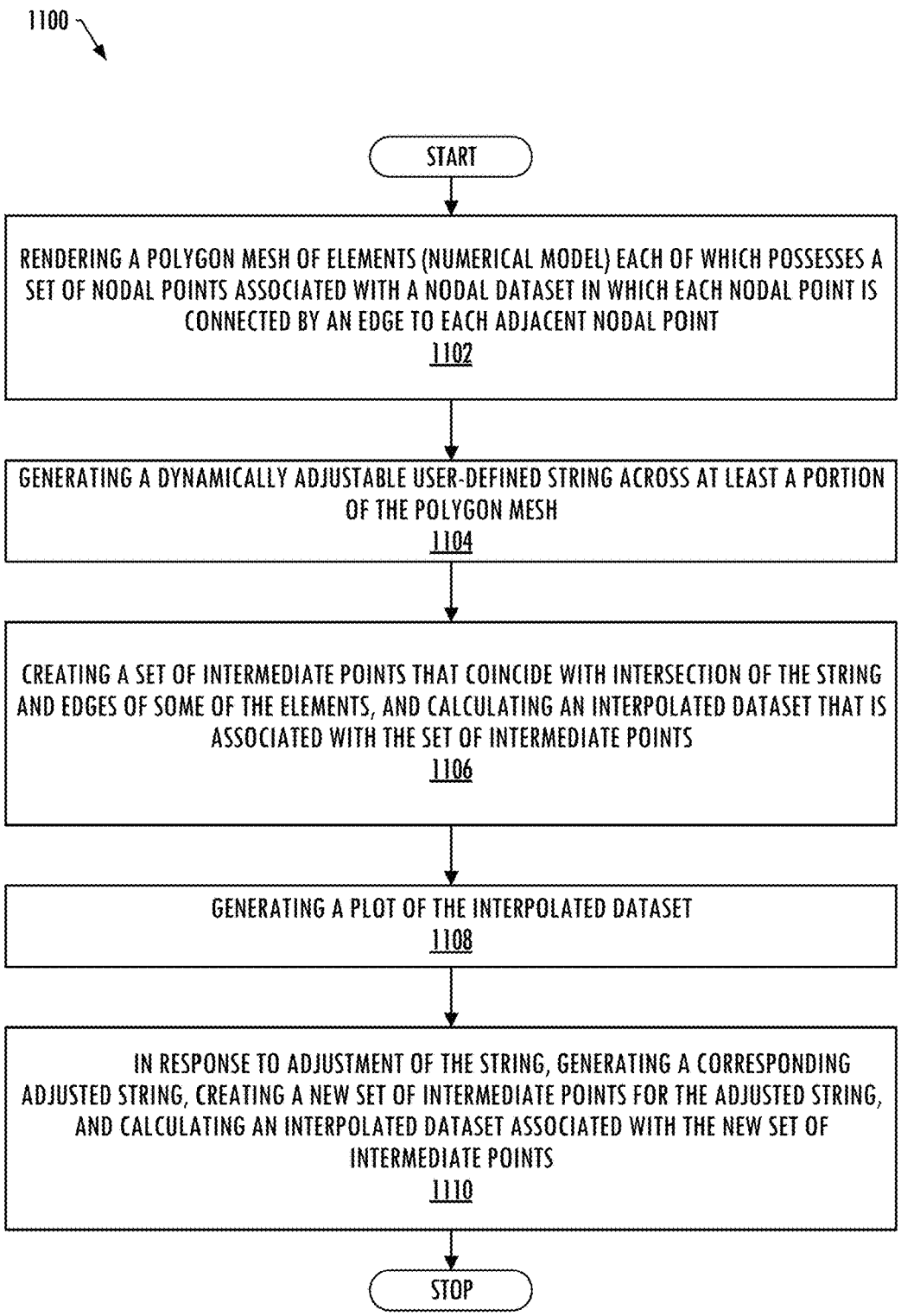
FIG. 11 is a flow diagram illustrating various operations of a method for at least post processing a fine element model, in accordance with an example implementation.

FIG. 11 illustrates a flowchart including various operations of a method 1100 of at least post processing a numerical model in accordance with an example implementation of the present disclosure. As shown at block 1102, the method may include rendering a numerical model of a structural product. The numerical model may represent the structural product by a mesh of elements. Each of the elements may possess a set of nodal points associated with a nodal dataset in which each nodal point is connected by an edge to each adjacent nodal point. The method may include generating a user-defined string across at least a portion of the mesh in which the string may be dynamically adjustable, as shown at block 1104. In one example implementation, the string does not align with a row of adjacent nodes.

The method may also include creating a set of intermediate points that coincide with intersection of the string and edges of at least some of the elements of the mesh, and calculating an interpolated dataset with which the set of intermediate points is associated, as shown in block 1106. The interpolated dataset may be calculated from the nodal dataset of each set of nodal points including a nodal point of the at least some of the nodal points.

As shown at block 1108, the method may include generating a plot of the interpolated dataset. In response to the adjustment of the string, the method may include generating a corresponding adjusted string, creating a new set of intermediate points that coincide with intersection of the adjusted string and edges of at least some of the elements of the mesh, and calculating an interpolated dataset with which the new set of intermediate points is associated, as shown at block 1110. The method may allow for plots to be generated, in real-time, in relation to an adjustment of the string, such that a user may dynamically search for an optimum condition in the plot by monitoring the shape of the plot while simultaneously adjusting the string.

Implementation of the disclosed system and method allows for more efficient meshing as it reduces the time required to produce a mesh and avoids the usage of multiple iterations during the processing of a model as a modeler is not required to arrange the mesh to have an adjacent row of nodes along a path that an operator anticipates to be useful or important in order to facilitate plotting at later stages. As such, the mesh may be better quality (better aspect ratios) as a result of not being forced into particular geometry to accommodate such a node line.

According to example implementations of the present disclosure, the system 100 and its subsystems and/or components including the pre-processing system 102, processing system 104, and/or post-processing system 106 may be implemented by various means. Similarly, the example post-processing systems 200, 400 including each of their respective elements may be implemented by various means according to example implementations. Means for implementing the systems, subsystems and their respective elements may include hardware, alone or under direction of one or more computer programs from a computer-readable storage medium.

In some examples, one or more apparatuses may be provided that are configured to function as or otherwise implement the systems, subsystems, tools and respective elements shown and described herein. In examples involving more than one apparatus, the respective apparatuses may be connected to or otherwise in communication with one another in a number of different manners, such as directly or indirectly via a wired or wireless network or the like.

Figure 12:
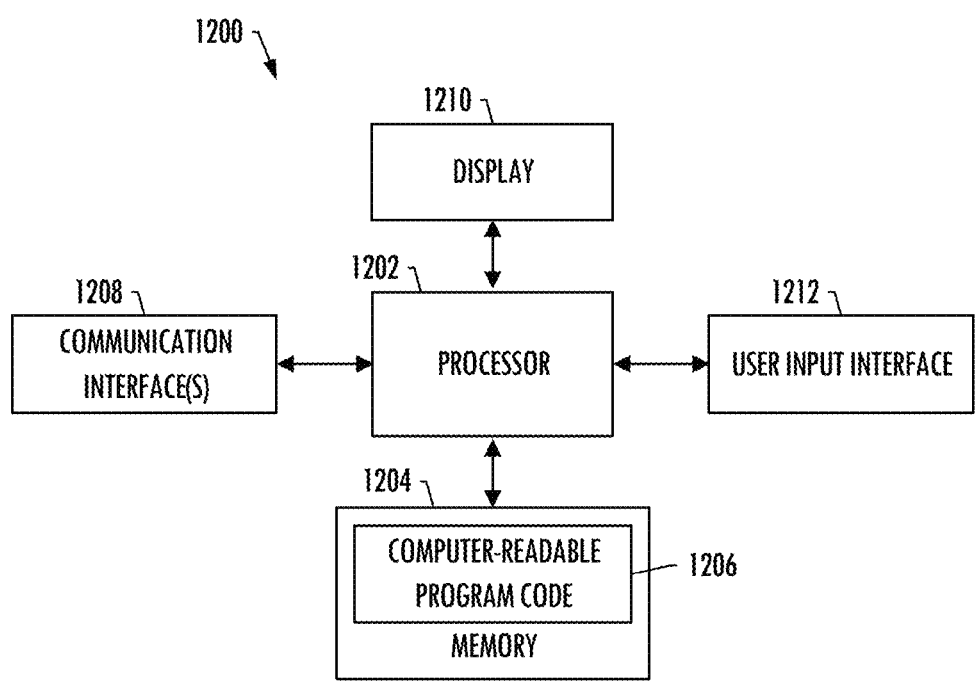
FIG. 12 illustrates an apparatus according to some example implementations.

FIG. 12 illustrates an apparatus 1200 according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 1202 (e.g., processor unit) connected to a memory 1204 (e.g., storage device).

The processor 1202 is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 1204 (of the same or another apparatus).

The processor 1202 may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory 1204 is generally any piece of computer hardware that is capable of storing information such as, for example, data, computer programs (e.g., computer-readable program code 1206) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface 1208 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 1210 and/or one or more user input interfaces 1212 (e.g., input/output unit). The display may be configured to present or otherwise display information to a user, suitable examples of which include a liquid crystal display (LCD), light-emitting diode display (LED), plasma display panel (PDP) or the like.

The user input interfaces 1212 may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 1200 may include a processor 1202 and a computer-readable storage medium or memory 1204 coupled to the processor, where the processor is configured to execute computer-readable program code 1206 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of design and verification of a structural product that is an aircraft or one or more component parts of an aircraft, the method comprising:
   measuring a physical instance of the structural product using a measurement tool that is or includes a thickness gauge, ultrasonic non-destructive inspection probe, load cell or strain gauge, the measurement tool producing measurements for the physical instance of the structural product;
   rendering a numerical model of the structural product, the numerical model representing the structural product by a mesh of elements each of which possesses a set of nodal points associated with a nodal dataset in which each nodal point is connected by an edge to each adjacent nodal point, and in which the nodal dataset for each set of nodal points includes values of a property or state of the structural product at respective nodal points of the set of nodal points;

generating a user-defined string across at least a portion of the mesh;

creating a set of intermediate points that coincide with intersection of the string and edges of elements of mesh, identifying disconnected segments in the mesh based on the intersection, calculating an interpolated dataset with which the set of intermediate points is associated, the interpolated dataset being calculated from the nodal dataset of the set of nodal points possessed by each element of the elements, automatically interpolating the disconnected segments in the mesh;

wherein the string is dynamically adjustable, such that in response to adjustment of the string, the method further comprises generating a corresponding adjusted string, creating a new set of intermediate points that coincide with intersection of the adjusted string and edges of the elements of the mesh, and calculating a new interpolated dataset with which the new set of intermediate points is associated;

simultaneously generating a plot of the new interpolated dataset and a plot of a corresponding dataset of the measurements; and verifying the physical instance of the structural product based on comparison of the corresponding dataset with the new interpolated dataset, and the interpolated segments in the mesh previously disconnected.

2. The method of claim 1, wherein generating the string includes automatically generating the string based on one or more user-defined parameters of a slice plane that intersects the mesh at the string.

3. The method of claim 2 further comprising:

receiving the one or more user-defined parameters via respectively one or more graphical user interface control elements, wherein the adjustment of the string is effectuated by adjustment of at least one of the one or more user-defined parameters; and receiving the adjustment of the at least one of the one or more user-defined parameters via at least one of the one or more graphical user interface control elements.

4. The method of claim 1, wherein the string intersects at least one nodal point of at least one set of nodal points, and generating the plot of the new interpolated dataset includes generating the plot of the new interpolated dataset and data of the at least one nodal point from the nodal dataset for the at least one set of nodal points.

5. The method of claim 1, wherein the nodal dataset for each set of nodal points includes values of a geometric property of the structural product at respective nodal points of the set of nodal points.

6. The method of claim 1, wherein the numerical model is a finite element model representing the structural product by a mesh of finite elements, and the method further comprises performing finite element analysis of the finite element model to produce the nodal dataset for the set of nodal points of each of the finite elements of the mesh, the nodal dataset for each set of nodal points including values of a state variable at respective nodal points of the set of nodal points.

7. An apparatus for design and verification of a structural product that is an aircraft or one or more component parts of an aircraft, the apparatus comprising a processor and a memory storing executable instructions that, in response to execution by the processor, cause the apparatus to at least:

receive measurements for a physical instance of the structural product;

render a numerical model of a structural product, the numerical model representing the structural product by a mesh of elements each of which possesses a set of nodal points associated with a nodal dataset in which each nodal point is connected by an edge to each adjacent nodal point, and in which the nodal dataset for each set of nodal points includes values of a property or state of the structural product at respective nodal points of the set of nodal points;

generate a user-defined string across at least a portion of the mesh;

create a set of intermediate points that coincide with intersection of the string and edges of elements of the mesh, identify disconnected segments in the mesh based on the intersection, calculate an interpolated dataset with which the set of intermediate points is associated, the interpolated dataset being calculated from the nodal dataset of the set of nodal points possessed by each element of the elements, automatically interpolate the disconnected segments in the mesh;

wherein the string is dynamically adjustable such that in response to adjustment of the string, the apparatus is further caused to generate a corresponding adjusted string, create a new set of intermediate points that coincide with intersection of the adjusted string and edges of the elements of the mesh, and calculate an new interpolated dataset with which the new set of intermediate points is associated, simultaneously generate a plot of the new interpolated dataset and a plot of a corresponding dataset of the measurements;

verify the physical instance of the structural product based on comparison of the corresponding dataset with the new interpolated dataset, and the interpolated segments in the mesh previously disconnected.

8. The apparatus of claim 7, wherein the apparatus being caused to generate the string includes being caused to automatically generate the string based on one or more user-defined parameters of a slice plane that intersects the mesh at the string.

9. The apparatus of claim 8, wherein the apparatus is further caused to receive the one or more user-defined parameters via respectively one or more graphical user interface control elements, and wherein the adjustment of the string is effectuated by adjustment of at least one of the one or more user-defined parameters, the apparatus being further caused to receive the adjustment of the at least one of the one or more user-defined parameters via at least one of the one or more graphical user interface control elements.

10. The apparatus of claim 7, wherein the string intersects at least one nodal point of at least one set of nodal points, and the apparatus being caused to generate the plot of the new interpolated dataset includes being caused to generate the plot of the new interpolated dataset and data of the at least one nodal point from the nodal dataset for the at least one set of nodal points.

11. The apparatus of claim 7, wherein the nodal dataset for each set of nodal points includes values of a geometric property of the structural product at respective nodal points of the set of nodal points.

12. The apparatus of claim 7, wherein the numerical model is a finite element model representing the structural product by a mesh of finite elements, and wherein the memory stores further executable instructions that, in response to execution by the processor, cause the apparatus to further:

perform finite element analysis of the finite element to produce the nodal dataset for the set of nodal points of each of the finite elements of the mesh, the nodal dataset for each set of nodal points including values of a state variable at respective nodal points of the set of nodal points.

13. A non-transitory computer-readable storage medium for design and verification of a structural product that is an aircraft or one or more component parts of an aircraft, the non-transitory computer-readable storage medium having computer-readable program code portions stored therein that in response to execution by a processor, cause an apparatus to at least:

receive measurements for a physical instance of the structural product render a numerical model of a structural product, the numerical model representing the structural product by a mesh of elements each of which possesses a set of nodal points associated with a nodal dataset in which each nodal point is connected by an edge to each adjacent nodal point, and in which the nodal dataset for each set of nodal points includes values of a property or state of the structural product at respective nodal points of the set of nodal points;

generate a user-defined string across at least a portion of the mesh;

create a set of intermediate points that coincide with intersection of the string and edges of elements of the mesh, identify disconnected segments in the mesh based on the intersection, calculate an interpolated dataset with which the set of intermediate points is associated, the interpolated dataset being calculated from the nodal dataset of the set of nodal points possessed by each element of the elements, automatically interpolate the disconnected segments in the mesh;

wherein the string is dynamically adjustable such that in response to adjustment of the string, the apparatus is further caused to generate a corresponding adjusted string, create a new set of intermediate points that coincide with intersection of the adjusted string and edges of the elements of the mesh, and calculate a new interpolated dataset with which the new set of intermediate points is associated, simultaneously generate a plot of the new interpolated dataset and a plot of a corresponding dataset of the measurements;

verify the physical instance of the structural product based on comparison of the corresponding dataset with the new interpolated dataset, and the interpolated segments in the mesh previously disconnected.

14. The non-transitory computer-readable storage medium of claim 13, wherein the apparatus being caused to generate the string includes being caused to automatically generate the string based on one or more user-defined parameters of a slice plane that intersects the mesh at the string.

15. The non-transitory computer-readable storage medium of claim 14 having further computer-readable program code portions stored therein that in response to execution by the processor, cause the apparatus to:

receive the one or more user-defined parameters via respectively one or more graphical user interface control elements, wherein the adjustment of the string is effectuated by adjustment of at least one of the one or more user-defined parameters; and receive the adjustment of the at least one of the one or more user-defined parameters via at least one of the one or more graphical user interface control elements.

16. The non-transitory computer-readable storage medium of claim 13, wherein the string intersects at least one nodal point of at least one set of nodal points, and the apparatus being caused to generate the plot of the new interpolated dataset includes being caused to generate the plot of the new interpolated dataset and data of the at least one nodal point from the nodal dataset for the at least one set of nodal points.

17. The non-transitory computer-readable storage medium of claim 13, wherein the nodal dataset for each set of nodal points includes values of a geometric property of the structural product at respective nodal points of the set of nodal points.

18. The non-transitory computer-readable storage medium of claim 13, wherein the numerical model is a finite element model representing the structural product by a mesh of finite elements, and the computer-readable storage medium has further computer-readable program code portions stored therein that in response to execution by the processor, cause the apparatus to perform finite element analysis of the finite element model to produce the nodal dataset for the set of nodal points of each of the finite elements of the mesh, the nodal dataset for each set of nodal points including values of a state variable at respective nodal points of the set of nodal points.

* * * * *